United States Patent

Bodegård et al.

[11] Patent Number: 5,994,163
[45] Date of Patent: Nov. 30, 1999

[54] METHOD OF MANUFACTURING THIN-FILM SOLAR CELLS

[75] Inventors: Marika Bodegård, Sollentuna; Jonas Hedström, Stockholm; Lars Stolt, Uppsala, all of Sweden

[73] Assignee: Nordic Solar Energy AB, Kista, Sweden

[21] Appl. No.: 08/817,693

[22] PCT Filed: Oct. 20, 1995

[86] PCT No.: PCT/SE95/01242

§ 371 Date: Apr. 17, 1997

§ 102(e) Date: Apr. 17, 1997

[87] PCT Pub. No.: WO96/13063

PCT Pub. Date: May 2, 1996

[30] Foreign Application Priority Data

Oct. 21, 1994 [SE] Sweden .................................. 9403609

[51] Int. Cl.[6] ............................ H01L 21/00; H01L 21/06
[52] U.S. Cl. .............................. 438/84; 438/95; 438/102
[58] Field of Search ................................ 438/95, 84, 102; 136/265, 258

[56] References Cited

U.S. PATENT DOCUMENTS

| 4,623,601 | 11/1986 | Lewis et al. | 430/69 |
| 4,873,118 | 10/1989 | Elias et al. | 427/39 |
| 4,915,745 | 4/1990 | Pollock et al. | 136/265 |
| 5,028,274 | 7/1991 | Basol et al. | 136/264 |
| 5,626,688 | 5/1997 | Pabst et al. | 136/265 |
| 5,730,852 | 3/1998 | Bhattacharya et al. | 205/192 |

OTHER PUBLICATIONS

V.N. Vysotskii et al., "Photovoltaic Cells with Aluminum Contacts and a Base Partially Doped with Lithium", Applied Solar Energy, vol. 3, No. 27, 1991, pp. 16–19.

Primary Examiner—Brian Dutton
Attorney, Agent, or Firm—Alfred J. Mangels

[57] ABSTRACT

A method of manufacturing thin-film solar cells that include a layer of copper indium selenide ($CuInSe_2$) that is applied in one manufacturing step onto a substrate that includes a metal layer that defines an electrical back contact layer of the solar cell. A layer that contains an alkali metal, such as sodium, is formed on the cell structure before the $CuInSe_2$ layer is applied.

11 Claims, 1 Drawing Sheet

METHOD OF MANUFACTURING THIN-FILM SOLAR CELLS

BACKGROUND OF THE INVENTION

1. Field of the Invention

The present invention relates to a method of manufacturing thin-film solar cells.

2. Description of the Related Art

CuInSe$_2$ (copper indium selenide)—thin-film solar cells are normally produced by depositing a molybdenum (Mo) back contact onto a substrate, for instance a glass substrate. Copper, indium and selenide are then deposited onto the back contact to form a CuInSe$_2$ layer, the CuInSe$_2$ being formed by chemical reaction in a selenium-containing atmosphere. In this stage of manufacture, the structure is subjected to a temperature in the range of 350–600° C.

The CuInSe$_2$ layer is a p-type semiconductor. An n-type semiconductor is deposited on the CuInSe$_2$ layer to form a pn-junction, which forms the actual solar cell. The n-type semiconductor is most often comprised of a thin layer of CdS and a much thicker layer of ZnO, which provides the best structure. The ZnO layer forms a front side contact at the same time.

It is desired to increase the efficiency of solar cells of this kind.

The present invention provides a method of manufacturing solar cells which greatly increases the efficiency of the solar cell produced.

SUMMARY OF THE INVENTION

Accordingly, the present invention relates to a method of manufacturing thin-film solar cells wherein a structure which includes a metal layer that forms an electrical back contact in the solar cell is coated with a layer of copper indium selenide (CuInSe$_2$) in a manufacturing stage. The back contact is applied to a substrate, wherein the method is characterized by applying a layer of alkali metal to the structure prior to applying the CuInSe$_2$ layer.

According to one particularly preferred embodiment of the invention, the alkali metal that is applied to the structure prior to applying the CuInSe$_2$ layer is sodium (Na) or potassium (K).

By copper indium selenide layer as used in the present context and in the claims, is meant a copper indium selenide layer of different compositions and containing different alloying substances, primarily gallium and sulphur. The term copper indium selenide as used here concerns primarily the compounds CuInSe$_2$, CuIn$_x$Ga$_{1-x}$Se$_2$ and CuIn$_x$Ga$_{1-x}$S$_y$Se$_{2-y}$.

The invention will be described below with reference to a layer of copper indium selenide that has the formula CuInSe$_2$.

BRIEF DESCRIPTION OF THE DRAWINGS

The present invention will now be described in more detail partly with reference to an exemplifying embodiment of the invention shown in the accompanying drawing.

DESCRIPTION OF THE PREFERRED EMBODIMENTS

Figure 1:
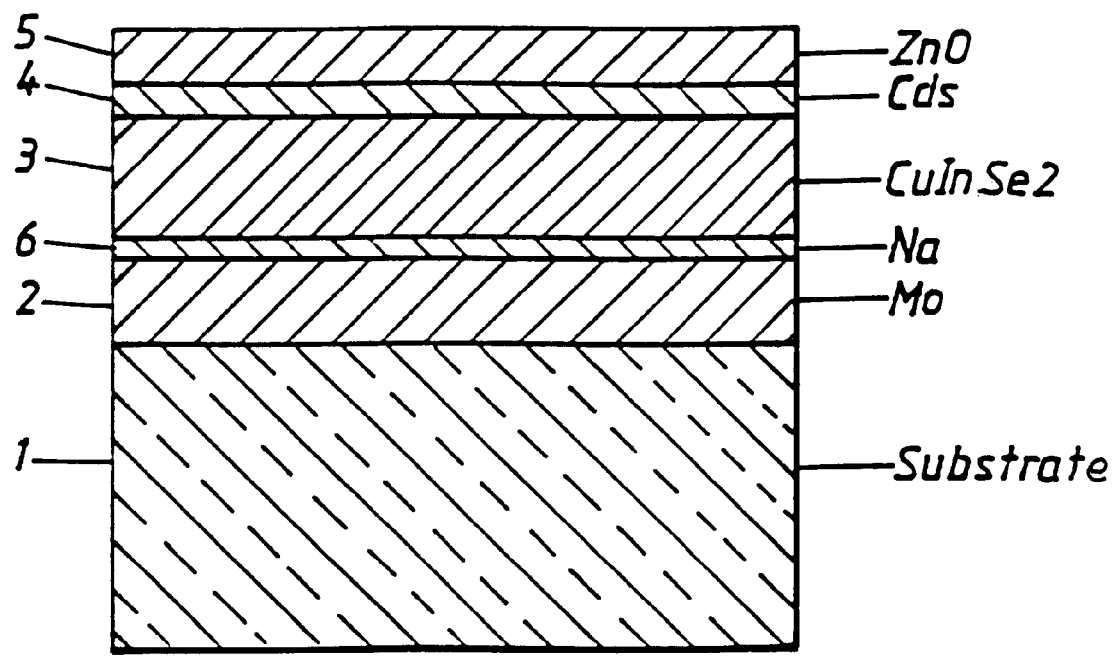
FIG. 1 illustrates a solar cell structure.

The present invention is based on the understanding that when sodium or elementary potassium in the form of elementary sodium or potassium, or a compound in which these basic substances are present, is applied to the surface on which the CuInSe$_2$ layer is to be built-up, for instance to the molybdenum layer, the grains in the polycrystalline CuInSe$_2$ film will be orientated more in a columnar structure. The grains will also be larger and the structure more dense. The resistivity in the CuInSe$_2$ layer is also reduced, meaning that a more effective p-doping is obtained, therewith resulting in a higher cell voltage.

Alkali metals other than sodium and potassium will provide the same effect. This applies at least to lithium, which has a low atomic weight.

FIG. 1 is a schematic sectional view of a thin-film solar cell. The substrate on which thin-film solar cells are built up may be large in size, for instance have a size of 1×0.4 meter. The substrate surface will therewith carry a very large number of cells that connect together electrically. FIG. 1 shows only one part of one such cell. The technique of producing a large number of separate but electrically connected cells on a substrate surface is well known to the art and will not be described in detail here.

A solar cell to which the invention can be applied nay be constructed in the following way. The substrate 1 will normally have the form of a glass sheet of suitable thickness, for instance a thickness of 2.0 mm. A molybdenum (Mo) layer 2 is first sputtered onto the glass surface. The molybdenum layer forms the back contact layer and the positive terminal of the finished cell. The molybdenum layer may have a thickness of 1,000 nanometers. There is then applied a CuInSe$_2$ layer 3, which may be given a thickness of 2,500 nanometers for instance. There is first applied to the layer 3 a cadmium sulphide (CdS) layer 4, which may be given a thickness of 50 nanometers for instance, and thereafter an electrical contact layer in the form of a transparent doped zinc-oxide layer (ZnO) 5, which may be given a thickness of 500 nanometers, for instance.

When sunlight falls on the solar cell, an electric voltage is produced between the electrical contact layer 5 (ZnO), which is the negative terminal, and the electrical back contact 2.

The invention is described below with reference to the use of sodium by way of example. It will be understood, however, that other alkali metals may be used with equal effect. It will also be understood that although the layer 6 of the illustrated solar cell is referred to as sodium, the layer 6 will in fact consist of the alkali metal that is used when this alkali metal is other than sodium.

According to the invention, a layer 6 containing an alkali metal, in the illustrated case sodium (Na), is formed on top of the back contact layer 2, i.e. on top of the molybdenum layer of the illustrated example, prior to applying the CuInSe$_2$ layer 3.

According to one preferred embodiment of the invention, sodium is applied on the electrical back contact layer, i.e. the metal layer 2 by vaporizing sodium selenide (Na$_2$Se).

According to another preferred embodiment of the invention, potassium is applied on the electrical back contact layer, i.e. the metal layer 2 by vaporizing potassium selenide (K$_2$Se).

According to another preferred embodiment, the alkali metal, in the illustrated case sodium, is applied simultaneously with the electrical back contact layer when said back contact layer is comprised of molybdenum.

According to another preferred embodiment of the invention, the layer which includes the alkali metal, in the illustrated case sodium, is applied to a thickness of from 50 to 500 nanometers.

According to another embodiment, the alkali metal layer also contains oxygen (O).

It has been found that when the CuInSe$_2$ layer is applied on top of the layer that contains sodium or potassium, the sodium or potassium will essentially disappear from the surface of the metal contact layer. When the CuInSe$_2$ layer is applied, sodium or potassium is again found at the grain boundaries in the CuInSe$_2$ layer and on the surface of the layer. When the CdS layer is then applied in a wet process, the sodium or the potassium compound will disappear from the surface, provided that the sodium or the potassium compound is soluble in the liquid used in the wet process. An electric contact layer is applied on top of the layer of cadmium sulfide, and that electric contact layer is preferably a layer of doped zinc oxide.

This method results in a very surprising increase in the efficiency of the solar cell described and shown by way of example, namely an increase of about 25%. The typical efficiency of such a solar cell of this nature to which the invention has not been applied is 12%. The efficiency increases to 15% when the invention is applied.

Although the present invention has been described with reference to a given solar cell structure, it will be understood that the present invention can be applied to other structures in which the electrical back contact layer 2 is not comprised of molybdenum but of some other suitable metal, such as tungsten, nickel, titanium or chromium.

Furthermore, substrates other than a glass that contains sodium may also be used. For instance, a glass which does not contain sodium may be used, as may also glass which contains sodium and which includes a diffusion barrier against sodium on the surface on which the electrical back contact layer is to be built up.

The invention shall not therefore be considered to be limited to the aforedescribed exemplifying embodiments thereof, since variations can be made within the scope of the following claims.

What is claimed is:

1. A method of manufacturing thin-film solar cells, said method comprising:

a. providing a substrate;

b. applying a metallic layer to a surface of the substrate, the metallic layer defining an electrical back contact layer;

c. depositing on the electrical back contact layer an intermediate layer containing an alkali metal;

d. forming on the intermediate layer a layer containing copper indium selenide to provide a p-type semiconductor layer; and e. depositing on the p-type semiconductor layer a layer of n-type semiconductor material to provide a solar cell having increased efficiency.

2. A method according to claim 1, wherein the intermediate layer contains the alkali metal sodium (Na).

3. A method according to claim 2, wherein said sodium is applied on the electrical back contact layer by vaporizing sodium selenide (Na$_2$Se).

4. A method according to claim 1, wherein the alkali metal-containing layer is applied simultaneously with the electrical back contact layer by sputtering and said electrical back contact layer includes molybdenum.

5. A method according to claim 1, wherein the layer containing the alkali metal has a thickness of from about 50 to about 500 nanometers.

6. A method according to claim 1, wherein the layer which includes the alkali metal also includes oxygen (O).

7. A method according to claim 1, wherein the electrical back contact layer is molybdenum (Mo).

8. A method according to claim 1, wherein the n-type semiconductor layer is formed by applying cadmium sulphide (CdS) on top of the copper-indium-selenide-containing layer, and by applying a second electrical contact layer on top of the layer of cadmium sulphide.

9. A method according to claim 8, wherein the second electrical contact layer is a layer of doped zinc oxide (ZnO).

10. A method according to claim 1, wherein the intermediate layer contains the alkali metal potassium (K).

11. A method according to claim 10 wherein said potassium is applied on the electrical back contact layer by vaporizing potassium selenide (K$_2$Se).

* * * * *